United States Patent
Tsuchiya et al.

(10) Patent No.: US 9,028,709 B2
(45) Date of Patent: May 12, 2015

(54) SURFACE TREATMENT COMPOSITION AND SURFACE TREATMENT METHOD USING SAME

(75) Inventors: Kohsuke Tsuchiya, Kiyosu (JP); Hitoshi Morinaga, Kiyosu (JP); Noboru Yasufuku, Kiyosu (JP); Shuhei Takahashi, Kiyosu (JP); Tomohiro Imao, Kiyosu (JP)

(73) Assignee: Fujimi Incorporated, Kiyosu-Shi (JP)

( * ) Notice: Subject to any disclaimer, the term of this patent is extended or adjusted under 35 U.S.C. 154(b) by 67 days.

(21) Appl. No.: 13/824,778

(22) PCT Filed: Sep. 23, 2011

(86) PCT No.: PCT/JP2011/071741
§ 371 (c)(1),
(2), (4) Date: Mar. 18, 2013

(87) PCT Pub. No.: WO2012/043418
PCT Pub. Date: Apr. 5, 2012

(65) Prior Publication Data
US 2013/0181159 A1    Jul. 18, 2013

(30) Foreign Application Priority Data
Sep. 27, 2010   (JP) .................... 2010-214812

(51) Int. Cl.
| C09K 13/00 | (2006.01) |
| C11D 1/825 | (2006.01) |
| C11D 11/00 | (2006.01) |
| H01L 21/02 | (2006.01) |
| C09K 3/14 | (2006.01) |
| C09G 1/02 | (2006.01) |
| C11D 1/72 | (2006.01) |
| C11D 1/722 | (2006.01) |

(52) U.S. Cl.
CPC . *C09K 13/00* (2013.01); *C11D 1/72* (2013.01); *C11D 1/722* (2013.01); *C11D 1/825* (2013.01); *C11D 11/0047* (2013.01); *H01L 21/02052* (2013.01); *H01L 21/02024* (2013.01); *C09K 3/1463* (2013.01); *C09G 1/02* (2013.01)

(58) Field of Classification Search
CPC ...................................................... C09K 13/00
USPC ......................................... 252/79.1; 134/1.3
See application file for complete search history.

(56) References Cited

U.S. PATENT DOCUMENTS

| 7,198,680 | B1 * | 4/2007 | Dooley et al. ............ 134/26 |
| 7,204,865 | B2 | 4/2007 | Yamada |
| 7,459,398 | B2 | 12/2008 | Minamihaba et al. |
| 7,718,535 | B2 | 5/2010 | Choi et al. |
| 2004/0237413 | A1 * | 12/2004 | Shida et al. ............ 51/309 |
| 2005/0054203 | A1 | 3/2005 | Yamada |
| 2005/0130428 | A1 | 6/2005 | Choi et al. |
| 2006/0030503 | A1 | 2/2006 | Minamihaba et al. |
| 2008/0124913 | A1 | 5/2008 | Choi et al. |
| 2008/0265205 | A1 * | 10/2008 | Oh et al. ............ 252/79.1 |

FOREIGN PATENT DOCUMENTS

| JP | 2001-240850 A | 9/2001 |
| JP | 2005-085858 A | 3/2005 |
| JP | 2005-175498 A | 6/2005 |
| JP | 2006-049709 A | 2/2006 |

* cited by examiner

*Primary Examiner* — Roberts Culbert
(74) *Attorney, Agent, or Firm* — Foley & Lardner LLP

(57) ABSTRACT

A surface treatment composition of the present invention contains a first surfactant, a second surfactant, a basic compound, and water. The surface treatment composition has a pH of 8 or more. The second surfactant has a weight-average molecular weight one-half or less that of the first surfactant. The sum of the content of the first surfactant and the content of the second surfactant is 0.00001 to 0.1% by mass.

12 Claims, No Drawings

SURFACE TREATMENT COMPOSITION AND SURFACE TREATMENT METHOD USING SAME

TECHNICAL FIELD

The present invention relates to a surface treatment composition mainly used in an application of performing surface treatment, such as polishing, etching, rinsing, or washing, of a substrate. The present invention also relates to a kit for preparing the surface treatment composition, and a method for subjecting a substrate to surface treatment using the surface treatment composition.

BACKGROUND ART

Miniaturization of a design rule of semiconductor devices advances every year in accordance with high-degree integration and an increase in the speed of integrated circuits, such as ULSI circuits used for computers. Consequently, smaller defects on a semiconductor substrate have an adverse effect on the performance of the semiconductor device. At present, the control of nano-scale defects, which have not been conventionally problematic, is required.

A surface defect inspection device is used for the control of defects on a semiconductor substrate surface. Defects detected by a surface defect inspection device include foreign matter and residues on the semiconductor substrate. The foreign matter and the residues cannot be completely removed by a polishing process, a rinsing process, and a washing process. A common surface defect inspection device irradiates the surface of a semiconductor substrate with light, such as a laser beam, and receives and analyzes the reflected light as a signal to detect the existence and size of the defects.

When a polished, mirror-finished semiconductor substrate surface is irradiated with intense light, tarnish may be seen by diffused reflection caused by the roughness of the semiconductor substrate surface. The tarnish is referred to as haze. The haze can be used as the scale of the coarseness of a semiconductor substrate surface. When haze exists on a semiconductor substrate surface, diffused reflection light generated by the haze causes noise, which may hinder defect detection performed by a surface defect inspection device. Therefore, as the size of the defects to be detected, that the size of the defects to be controlled is smaller, the necessity of improving the haze level is increasing. It is known that the haze level of a semiconductor substrate surface is also strongly influenced by etching.

On the other hand, a surface treatment composition used to polish or etch a substrate generally contains a basic compound for etching the substrate surface. A surface treatment composition used to rinse or wash a substrate may also contain a basic compound for enhancing a rinsing or washing effect. However, when the pH of the surface treatment composition is set to 8 or more by blending a basic compound, roughness is disadvantageously apt to be generated on a substrate surface by the etching action caused by the basic compound. Therefore, when a substrate is subjected to surface treatment using a composition containing a basic compound and having a pH of 8 or more, reduction in the haze of the surface of the substrate that has been subjected to the surface treatment is required by controlling the etching action caused by the basic compound.

Patent Document 1 discloses a polishing composition containing a surfactant of a copolymer of polyoxyethylene and polyoxypropylene in order to mainly reduce the haze on a semiconductor substrate surface after polishing. However, the haze reduction effect caused by the polishing composition described in Patent Document 1 is not enough to control nano-scale defects.

PRIOR ART DOCUMENTS

Patent Document 1: Japanese Laid-Open Patent Publication No. 2005-85858

SUMMARY OF THE INVENTION

Problems that the Invention is to Solve

Accordingly, it is a main objective of the present invention to suppress the roughness of a substrate surface caused by non-uniform or excessive etching that may be generated by the action of a basic compound contained in a surface treatment composition, that is, to provide a surface treatment composition capable of further reducing the haze on a substrate surface.

Means for Solving the Problems

The inventors of the present invention have conducted earnest studies and have found that at least two surfactants having different molecular weights are blended in a surface treatment composition containing a basic compound and having a pH of 8 or more, and, more specifically, a first surfactant is blended in combination with a second surfactant having a weight-average molecular weight one-half or less that of the first surfactant, and thereby the etching action on a substrate surface caused by the basic compound can be controlled. The present invention has been accomplished based on this finding.

That is, in order to solve the above-mentioned problem and in accordance with a first aspect of the present invention, a surface treatment composition is provided containing a first surfactant, a second surfactant, a basic compound, and water, the surface treatment composition having a pH of 8 or more, the second surfactant having a weight-average molecular weight one-half or less that of the first surfactant, and the sum of the content of the first surfactant and the content of the second surfactant being 0.00001 to 0.1% by mass.

In accordance with a second aspect of the present invention, a kit for preparing the surface treatment composition according to the first aspect is provided.

In accordance with a third aspect of the present invention, a method for subjecting a substrate to surface treatment using the surface treatment composition according to the first aspect is provided.

Effects of the Invention

The present invention can suitably control the etching action on a substrate surface caused by a basic compound. Accordingly, the present invention provides a surface treatment composition, which can suppress the roughness of a substrate surface to reduce the haze, and a surface treatment method. The present invention also provides a kit capable of simply preparing such a surface treatment composition.

MODES FOR CARRYING OUT THE INVENTION

Hereinafter, embodiments according to the present invention will be described.

[1] Surface Treatment Composition of the Present Invention

A surface treatment composition of the present invention contains a first surfactant, a second surfactant, a basic compound, and water and has a pH of 8 or more.

<Surfactants>

The first surfactant and the second surfactant contained in the surface treatment composition of the present invention have molecular weights different from each other. Specifically, the second surfactant has a weight-average molecular weight one-half or less that of the first surfactant. When the weight-average molecular weight of the second surfactant exceeds one-half that of the first surfactant, a sufficient effect for suppressing the roughness of a substrate surface cannot be obtained.

In the surface treatment composition, the sum of the content of the first surfactant and the content of the second surfactant needs to be 0.00001% by mass or more and preferably 0.0001% by mass or more. When the sum of the contents of the first surfactant and the second surfactant is less than 0.00001% by mass, a sufficient effect for suppressing the roughness of a substrate surface cannot be obtained.

The sum of the content of the first surfactant and the content of the second surfactant in the surface treatment composition needs to be 0.1% by mass or less and preferably 0.05% by mass or less. When the sum of the contents of the first surfactant and the second surfactant exceeds 0.1% by mass, a sufficient effect for suppressing the roughness of a substrate surface cannot be obtained, and the surface treatment composition s disadvantageously apt to be foamed.

Although a detailed mechanism in which the roughness of a substrate surface is suppressed by using the first surfactant and the second surfactant in combination is not clear, the mechanism will be assumed as follows. That is, both the first surfactant and the second surfactant are adsorbed on a substrate surface to act to protect the substrate surface from non-uniform or excessive etching that may be generated by the action of a basic compound. Because the first surfactant has a comparatively large molecular weight, the first surfactant has an effect for protecting the substrate surface greater than that of the second surfactant. However, the first surfactant cannot be closely adsorbed on the substrate surface. On the other hand, the second surfactant having a comparatively small molecular weight can be adsorbed on the substrate surface so that gaps on which the first surfactant cannot be adsorbed are filled. Therefore, it is considered that the substrate surface can be closely protected by using the first surfactant and the second surfactant in combination to suppress the roughness of the substrate surface.

The ratio of the total number of carbon atoms of the second surfactant to the sum of the total number of carbon atoms of the first surfactant and the total number of carbon atoms of the second surfactant is preferably 1% or more, more preferably, 5% or more, still more preferably, 15% or more, and most preferably, 30% or more. When the ratio is 1% or more, and more specifically 5% or more, 15% or more, or 30% or more, the roughness of a substrate surface can be further suppressed. Although the reason is not clear, it is considered that carbon atoms contained in the second surfactant serve as adsorption points when the second surfactant is adsorbed on a substrate surface. Therefore, it is assumed that the effect of the second surfactant adsorbed on a substrate surface so that gaps on which the first surfactant cannot be adsorbed are filled is likely to be exhibited by an increase in the total number of carbon atoms of the second surfactant.

The ratio of the total number of carbon atoms of the second surfactant to the sum of the total number of carbon atoms of the first surfactant and the total number of carbon atoms of the second surfactant is preferably 90% or less, more preferably, 85% or less, still more preferably, 75% or less, and most preferably, 65% or less. When the ratio is 90% or less, and more specifically 85% or less, 75% or less, or 65% or less, the roughness of a substrate surface can be further suppressed. Although the reason is not clear, the reason is assumed to be that the contribution of the first surfactant, which has a large effect for protecting a substrate surface, is increased.

The total number of carbon atoms of the first surfactant and the total number of carbon atoms of the second surfactant can be obtained as follows. The number of moles of each surfactant is calculated from the content of the surfactant in the surface treatment composition and the weight-average molecular weight of the surfactant. The number of molecular chains of the surfactant is calculated by multiplying the number of moles by Avogadro constant. Then, an average carbon number per one molecule chain of the surfactant is calculated from the weight-average molecular weight and structural formula of the surfactant. The average carbon number is multiplied by the previously calculated number of the molecular chains of the surfactant. That is, the total number of carbon atoms of each surfactant can be calculated by the following formula.

The total number of carbon atoms of each surfactant= (average carbon number per one molecule chain of surfactant)×(mass of surfactant/weight-average molecular weight of surfactant)×(Avogadro constant)

Although the weight-average molecular weight of the first surfactant is not particularly limited, the weight-average molecular weight is preferably 500 to 20,000 and, more preferably, 1,000 to 10,000 in order to further improve the effect for suppressing the roughness of a substrate surface.

The weight-average molecular weight of the second surfactant is not particularly limited as long as the weight-average molecular weight of the second surfactant is one-half or less that of the first surfactant. However, the weight-average molecular weight of the second surfactant is preferably 200 to 10,000, more preferably, 200 to 5,000, and still more preferably, 300 to 1,000 in order to further improve the effect for suppressing the roughness of a substrate surface.

Although each of the first surfactant and the second surfactant may be independently an ionic surfactant or a non-ionic surfactant, both the surfactants are preferably non-ionic surfactants. Because the foaming of the surface treatment composition when non-ionic surfactants are used is suppressed compared with the case where a cationic surfactant or an anionic surfactant is used, handling in manufacture and use of the surface treatment composition is facilitated. Because non-ionic surfactants do not change the pH of the surface treatment composition, the control of the pH of the surface treatment composition is facilitated in manufacture and use. Furthermore, non-ionic surfactants have excellent biodegradability and weak toxicity to a living body and therefore have a small influence on the environment and little fear for handling.

The kinds of the first surfactant and the second surfactant used in the surface treatment composition of the present invention are not particularly limited. Specific examples thereof include polyoxyalkylene adducts such as polyoxyethylene alkyl ether, polyoxyethylene alkyl phenyl ether, polyoxyethylene alkylamine, polyoxyethylene fatty acid ester, polyoxyethylene glycel ether fatty acid ester, and polyoxyethylene sorbitan fatty acid ester; oxyalkylene polymer simple substances such as polyethylene glycol and polypropylene glycol; and a copolymer of a plurality of oxyalkylenes such as a diblock type, triblock type, random type, and alternate type of polyoxyethylene-polyoxypropylene.

Polyoxyethylene polyoxyalkylene copolymer, polyoxyethylene alkyl ether, and polyoxyethylene sorbitan fatty acid ester can be suitably used as the first surfactant. Of these, triblock type polyoxyethylene polyoxyalkylene copolymer is most preferable. The first surfactant may include one of these compounds, or two or more thereof in combination.

Polyoxyethylene alkyl ether, polyoxyethylene sorbitan fatty acid ester, and polyethylene glycol can be suitably used as the second surfactant. Of these, polyoxyethylene alkyl ether and, more specifically, straight chain polyoxyethylene alkyl ether is the most preferable. The second surfactant may include one of these compounds or two or more thereof in combination.

Although the HLB (Hydrophile-Lipophile Balance) value of the first surfactant and the HLB value of the second surfactant are not particularly limited, the HLB values are preferably 12 or more from the point of obtaining good water solubility. When the HLB values of the first surfactant and the second surfactant are 12 or more, the first surfactant and the second surfactant hardly remain on a substrate surface. Furthermore, the stability of the surface treatment composition is improved. The HLB value herein is defined by the Griffin method. According to the Griffin method, the HLB value is calculated by 20× the sum of the molecular weights of hydrophilic moieties/ the sum of the molecular weights of hydrophilic moieties and hydrophobic moieties. Examples of hydrophilic moieties include an oxyethylene group, a hydroxyl group, a carboxyl group, and an ester. Examples of hydrophobic moieties include an oxypropylene group, an oxybutylene group, and an alkyl group.

<Basic Compound>

The surface treatment composition of the present invention contains the basic compound. The pH of the surface treatment composition is adjusted to 8 or more by adding the basic compound. As described above, when the pH of the surface treatment composition is 8 or more and, more specifically, 9 or more, an etching action caused by the basic compound is increased. Accordingly, the roughness of a substrate surface is apt to be generated. However, the roughness of a substrate surface is suppressed by the above-mentioned actions of the first surfactant and the second surfactant.

The basic compound used in the surface treatment composition of the present invention is not particularly limited. Specific examples thereof include ammonia, potassium hydrate, sodium hydrate, tetramethylammonium hydrate, tetraethylammonium hydrate, ammonium acid carbonate, ammonium carbonate, potassium bicarbonate, potassium carbonate, sodium hydrogen carbonate, sodium carbonate, methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, and N-methylpiperazine. The basic compound may include one of these compounds or two or more of these compounds in combination.

When a substrate to be subjected to surface treatment using the surface treatment composition is a silicon wafer, the basic compound is preferably ammonia, an ammonium salt, an alkali metal hydroxide, an alkali metal salt, or a quaternary ammonium hydroxide, more preferably, ammonia, potassium hydrate, sodium hydrate, tetramethylammonium hydrate, tetraethylammonium hydrate, ammonium hydrogen carbonate, ammonium carbonate, potassium hydrogen carbonate, potassium carbonate, sodium hydrogen carbonate, or sodium carbonate, still more preferably, ammonia, potassium hydrate, sodium hydrate, tetramethylammonium hydrate, or tetraethylammonium hydrate, and most preferably, ammonia in order to suppress metallic contamination of the substrate subjected to the surface treatment.

The content of the basic compound in the surface treatment composition is not particularly limited as long as the pH of the surface treatment composition is 8 or more. The content is generally 0.0001% by mass to 0.5% by mass. However, when a substrate to be subjected to surface treatment using the surface treatment composition is a silicon wafer, the content of the basic compound in the surface treatment composition is preferably 0.0001% by mass to 0.5% by mass and, more preferably, 0.001% by mass to 0.25% by mass. When the content of the basic compound is within any of the above-mentioned ranges, the basic compound has a practical advantage in that the etching action caused by the basic compound is moderately alleviated by the functions of the first surfactant and the second surfactant.

<Water>

The water contained in the surface treatment composition functions to dissolve or disperse the other components contained in the surface treatment composition. It is preferable that the water does not contain, as much as possible, impurities that inhibit the actions of the other components. Specifically, ion-exchange water, from which foreign matter is removed by being passed through a filter after removing impurity ions with an ion-exchange resin, pure water, ultrapure water, or distilled water is preferable.

<Particle Component>

The surface treatment composition may contain a particle component. The particle component functions to physically polish a substrate surface.

Specific examples of the particle component to be used include silicon carbide, silicon dioxide, alumina, ceria, zirconia, and diamond. However, the particle component is not limited thereto. Silicon dioxide such as colloidal silica, fumed silica, or sol-gel-derived silica is preferable because the surface roughness of a substrate is further reduced when silicon dioxide is used.

When the surface treatment composition is used for polishing a semiconductor substrate, particularly polishing a silicon wafer, the particle component contained in the surface treatment composition is preferably colloidal silica or fumed silica, and more preferably, colloidal silica. When colloidal silica or fumed silica, particularly colloidal silica is used, scratches generated on a substrate surface by polishing are decreased. The particle component may include one of the above-described materials, or two or more thereof in combination.

When the surface treatment composition is used for polishing a semiconductor substrate, particularly polishing a silicon wafer, the particle component contained in the surface treatment composition preferably has an average primary particle diameter of 5 to 100 nm, and more preferably, 10 to 40 nm. The average primary particle diameter is obtained from a specific surface area determined by a specific surface area determination method (BET method) of powder by using gas adsorption.

When the surface treatment composition is used for polishing a semiconductor substrate, particularly polishing a silicon wafer, the content of the particle component contained in the surface treatment composition is preferably 0.01% by mass or more, and more preferably, 0.05% by mass or more. When the content of the particle component is 0.01% by mass or more, and more specifically 0.05% by mass or more, the polishing rate of a substrate is improved.

The content of the particle component contained in the surface treatment composition is also preferably 5% by mass or less, and more preferably, 1% by mass or less. When the content of the particle component is 5% by mass or less, and more specifically 1% by mass or less, the dispersion stability of the surface treatment composition is improved.

<Wetting Agent>

The surface treatment composition may further contain a wetting agent. The wetting agent is effective in keeping a substrate surface hydrophilic. When the wettability of a substrate surface is reduced, foreign matters adhering to the substrate is apt to remain without being removed by washing. When the foreign matters remain on a substrate, the surface accuracy of the substrate may be reduced.

Examples of the wetting agent to be used include a cellulose derivative such as hydroxyethyl cellulose, hydroxypropyl cellulose, and carboxymethyl cellulose; a vinyl polymer such as polyvinyl alcohol, polyvinyl pyrrolidone, and poly-N-vinylformamide; a polysaccharide such as starch, cyclodextrin, trehalose, and pullulan; polyacrylamide; and polymethylmethacrylate. Because a cellulose derivative has high potency to apply wettability to a substrate surface, can be easily washed out, and do not remain on the substrate, a cellulose derivative is preferable. Of these, hydroxyethyl cellulose is particularly preferable.

The weight-average molecular weight of the wetting agent to be used is generally 30,000 to 2,000,000. However, when the surface treatment composition is used for polishing a semiconductor substrate, particularly for polishing a silicon wafer, the weight-average molecular weight of the wetting agent is preferably 50,000 to 1,000,000. When the weight-average molecular weight of the wetting agent is 1,000,000 or less, the dispersion stability of the surface treatment composition is improved. When the weight-average molecular weight of the wetting agent is 50,000 or more, a function to apply the wettability to a substrate surface is sufficiently exhibited.

The content of the wetting agent in the surface treatment composition is generally 0.001 to 1% by mass. However, when the surface treatment composition is used for polishing a semiconductor substrate, particularly for polishing a silicon wafer, the content of the wetting agent is preferably 0.001 to 0.5% by mass. When the content of the wetting agent is 0.5% by mass or less, the dispersion stability of the surface treatment composition is improved. When the content of the wetting agent is 0.001% by mass or more, a function to apply the wettability to a substrate surface is sufficiently exhibited.

The surface treatment composition of the present invention is used for subjecting a substrate to surface treatment such as polishing, rinsing, washing, and etching. Of these, the surface treatment composition is preferably used in a final polishing process, a rinsing process, or a washing process in which the roughness of the substrate surface particularly causes a problem.

Although a substrate to be subjected to surface treatment using the surface treatment composition of the present invention is not particularly limited, a semiconductor substrate or a magnetic substrate, and more specifically a silicon substrate, an $SiO_2$ substrate, an SOI (silicon on insulator) substrate, a plastic substrate, a glass substrate, or a quartz substrate, in which the surface roughness generated by etching caused by the basic compound is apt to cause a problem, is suitable. Of these, the surface treatment composition of the present invention can be preferably used in surface treatment of a silicon wafer requiring a smooth surface having high precision.

The surface treatment composition of the present invention can be manufactured by dissolving or dispersing the above-mentioned components other than water, in water according to an ordinary method.

The surface treatment composition of the present invention has the following advantages.

The surface treatment composition of the present invention contains the first surfactant and the second surfactant, wherein the second surfactant has a weight-average molecular weight one-half or less that of the first surfactant; and the sum of the content of the first surfactant and the content of the second surfactant in the surface treatment composition is 0.00001 to 0.1% by mass. The surface treatment composition of the present invention suppresses the roughness of a substrate surface subjected to surface treatment. Therefore, the surface treatment composition of the present invention can be used in an application of polishing, rinsing, washing, or etching a substrate surfaced. Of these, the surface treatment composition can be suitably used in applications for finally polishing the surface of a silicon wafer and for rinsing the surface of a polished substrate particularly requiring high surface accuracy.

The surface treatment composition of the present invention may be embodied as the following embodiments.

The surface treatment composition of the present invention may further contain a chelating agent. When the surface treatment composition contains a chelating agent, the metallic contamination of a substrate caused by the surface treatment composition can be suppressed. Examples of the usable chelating agent include an aminocarboxylic acid chelating agent and an organic phosphonic acid chelating agent. Examples of aminocarboxylic acid chelating agents include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriamine pentaacetic acid, sodium diethylenetriamine pentaacetate, triethylenetetramine hexaacetic acid, and sodium triethylenetetramine hexaacetate. Examples of organic phosphonic acid chelating agents include 2-aminoethylphosphonic acid, 1-hydroxyethylidene-1,1-diphosphonic acid, amino tri(methylenephosphonic acid), ethylenediamine tetrakis(methylenephosphonic acid), diethylenetriamine penta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methane hydroxy phosphonic acid, 2-phosphonobutane-1,2-dicarboxylic acid, 1-phosphonobutane-2,3,4-tricarboxylic acid, and α-methyl phosphonosuccinic acid.

The surface treatment composition of the present invention may further contain a known additive such as an antiseptic agent if needed.

[2] Kit of the Present Invention

A kit of the present invention is used for preparing the surface treatment composition of the present invention. The kit of the present invention contains the first surfactant, the second surfactant having a weight-average molecular weight one-half or less that of the first surfactant, and the basic compound.

One form of the kit is a form of an undiluted solution of the surface treatment composition which can prepare the surface treatment composition by water dilution. The kit having the form of the undiluted solution is easy to handle during circulation as a product. The surface treatment composition can also be advantageously prepared by a simple method of water dilution.

The other form of the kit is a multi-component kit obtained by dividing the components contained in the surface treatment composition into several parts and packing the components. The multi-component kit may be obtained by respectively and separately packing the components contained in the surface treatment composition, or may be packed in a state where any of the components is mixed with the other component.

[3] Surface Treatment Method of the Present Invention

A surface treatment method of the present invention is a method for subjecting a substrate to surface treatment using the surface treatment composition of the present invention. More specifically, the surface treatment method is a method for polishing, rinsing, washing, or etching the substrate. The surface treatment composition of the present invention can be used on the same apparatus and condition as those used in the conventional surface treatment of a substrate.

The surface treatment method of the present invention may be embodied as the following embodiment.

The surface treatment method of the present invention may be a method for polishing a substrate using the surface treatment composition containing the particle component. In this case, a polishing pad may be used together. Although a polishing pad to be used is not particularly limited, the polishing pad may be a nonwoven fabric type or a suede type. Alternatively, the polishing pad may contain a particle component, and may contain no particle component.

When a substrate is polished or rinsed with the surface treatment method of the present invention, a temperature when the surface treatment composition is used is not particularly limited. However, the temperature is preferably 5 to 60° C.

The polishing of a substrate performed by the surface treatment method of the present invention may be polishing for improving a damage layer of the substrate, or may be final polishing for finishing a surface layer of the substrate. Although a polishing period for improving a damage layer of the substrate depends on the depth of the damage layer, the polishing period is generally 0.1 to 10 hours. A polishing period of the final polishing for finishing a surface layer of the substrate is generally 30 minutes or less.

When a substrate is washed by the surface treatment method of the present invention, a brush, a diamond dresser, or an ultrasonic wave may be used together.

When a substrate is washed by the surface treatment method of the present invention, a temperature when the surface treatment composition is used is not particularly limited. However, the temperature is preferably 10 to 90° C. A washing period is generally 1 hour or less.

Examples

Next, examples and comparative examples of the present invention will be described.

All or a part of a first surfactant, a second surfactant, a basic compound, a particle component, and a wetting agent were mixed with ion-exchange water to prepare surface treatment compositions of Examples 1 to 15 and Comparative Examples 1 to 10. The details of the first surfactant and the second surfactant in each of the surface treatment compositions of Examples 1 to 15 and Comparative Examples 1 to 10 are shown in Table 1. Although not shown in Table 1, all the surface treatment compositions of Examples 1 to 15 and Comparative Examples 1 to 10 contained 0.18% by mass of colloidal silica having an average primary particle diameter of 25 nm as the particle component, 0.005% by mass of ammonia as the basic compound, and 0.01% by mass of hydroxyethyl cellulose having a weight-average molecular weight of 250,000 as the wetting agent, and had a pH set to 10.2. The value of the average primary particle diameter of the colloidal silica was determined using a surface area determination device FlowSorb II 2300 manufactured by Micromeritics Instrument Corporation. The sum of the content of the first surfactant and the content of the second surfactant in each of the surface treatment compositions, and the ratio of the total number of carbon atoms of the second surfactant to the sum of the total number of carbon atoms of the first surfactant and the total number of carbon atoms of the second surfactant are also shown in Table 1.

The surfaces of silicon wafers were polished under conditions described in Table 2 with the respective surface treatment compositions of Examples 1 to 15 and Comparative examples 1 to 10. The used silicon wafers had a disk shape having a diameter of 200 mm, P-type conduction, a crystal orientation of <100>, and a resistivity of 0.1 $\Omega \cdot cm$ or more and less than 100 $\Omega \cdot cm$. The silicon wafers were used after preliminarily polishing with a polishing slurry (trade name of GLANZOX 1104) manufactured by Fujimi Incorporated.

The surfaces of the polished silicon wafers by using the respective surface treatment compositions of Examples 1 to 15 and Comparative Examples 1 to 10 were measured by a wafer inspection device "Surfscan SP2" manufactured by KLA Tencor Corporation in DWO mode. The results of evaluation of haze levels of the surfaces of the polished silicon wafers based on the measurement are shown in the column "haze" in Table 1. In the column, "A" indicates that the haze level was reduced by 10% or more compared to Comparative Example 2; "B" indicates that the haze level was reduced by 5% or more and less than 10%; "C" indicates that the haze level was reduced by less than 5%, and "D" indicates that no reduction in the haze level was observed compared to Comparative Example 2.

The surfaces of a silicon wafers having P-type conduction, a crystal orientation of <100>, a resistivity of 0.1 $\Omega \cdot cm$ or more and less than 100 $\Omega \cdot cm$, and a size of 60 mm square were preliminarily polished with a polishing slurry (trade name of GLANZOX 1104) manufactured by Fujimi Incorporated, and then, were polished under conditions described in Table 3 with the respective surface treatment compositions of Examples 1 to 15 and Comparative Examples 1 to 10. The surfaces of the polished silicon wafers were rinsed in flowing water of a flow rate of 7 L/min for 10 seconds. Then, the silicon wafers were vertically stood and left at rest. After a lapse of 30 seconds, a maximum distance between the periphery of each silicon wafer and a wet region on the silicon wafer surface was measured. The results of evaluation of wettability of the polished silicon wafer surface based on the measurement are shown in the column "wettability" in Table 1. In the column, "A" indicates that the maximum distance between the periphery of the silicon wafer and the wet region was 5 mm or less; "B" indicates that the maximum distance was more than 5 mm and 40 mm or less, and "C" indicates that the maximum distance was more than 40 mm.

TABLE 1

| | First surfactant | | | Second surfactant | | | Sum of content of first surfactant and content of second surfactant [% by weight] | Total number of carbon atoms of second surfactant/sum of total number of carbon atoms of first surfactant and total number of carbon atoms of second surfactant [%] | Haze | Wettability |
|---|---|---|---|---|---|---|---|---|---|---|
| | Structure | Weight-average molecular weight | HLB value | Structure | Weight-average molecular weight | HLB value | | | | |
| Example 1 | PEO—PPO—PEO | 9000 | 16 | C10PEO5 | 378 | 12 | 0.001 | 52 | A | A |
| Example 2 | PEO—PPO—PEO | 9000 | 16 | C10PEO5 | 378 | 12 | 0.001 | 62 | A | A |
| Example 3 | PEO—PPO—PEO | 9000 | 16 | C10PEO5 | 378 | 12 | 0.001 | 69 | A | B |
| Example 4 | PEO—PPO—PEO | 9000 | 16 | C10PEO5 | 378 | 12 | 0.001 | 73 | A | B |
| Example 5 | PEO—PPO—PEO | 9000 | 16 | C10PEO5 | 378 | 12 | 0.001 | 77 | A | B |
| Example 6 | PEO—PPO—PEO | 9000 | 16 | C10PEO10 | 598 | 15 | 0.001 | 40 | A | A |
| Example 7 | PEO—PPO—PEO | 9000 | 16 | C10PEO10 | 598 | 15 | 0.001 | 50 | A | A |
| Example 8 | PEO—PPO—PEO | 9000 | 16 | C10PEO10 | 598 | 15 | 0.001 | 73 | A | B |
| Example 9 | PEO—PPO—PEO | 9000 | 16 | C10PEO10 | 598 | 15 | 0.001 | 67 | A | B |
| Example 10 | PEO—PPO—PEO | 9000 | 16 | C10PEO5 C24PEO20 | 378 1308 | 12 15 | 0.001 | 50 | A | A |
| Example 11 | C24PEO20 | 1308 | 15 | C10PEO10 | 598 | 15 | 0.0002 | 31 | A | B |
| Example 12 | C24PEO20 | 1308 | 15 | C10PEO10 | 598 | 15 | 0.0001 | 18 | A | B |
| Example 13 | C10PEO10 | 598 | 15 | PEG | 200 | 20 | 0.0002 | 6 | B | B |
| Example 14 | C12PEO15 | 846 | 15 | C8PEO6 | 394 | 13 | 0.0001 | 36 | A | B |
| Example 15 | PEO—PPO—PEO | 16000 | 17 | C24PEO20 | 1308 | 15 | 0.001 | 43 | B | B |
| Comparative Example 1 | — | — | — | — | — | — | — | — | D | A |
| Comparative Example 2 | PEO—PPO—PEO | 9000 | 16 | — | — | — | 0.001 | 0 | D | A |
| Comparative Example 3 | PEO—PPO—PEO | 9000 | 16 | — | — | — | 0.003 | 0 | D | A |
| Comparative Example 4 | — | — | — | PEG | 4000 | 20 | 0.0001 | 100 | D | A |
| Comparative Example 5 | — | — | — | C10PEO5 | 378 | 12 | 0.0001 | 100 | C | A |
| Comparative Example 6 | C12PEO40 | 1956 | 18 | C12PEO30 | 1506 | 17 | 0.0002 | 20 | D | C |
| Comparative Example 7 | C12PEO40 | 1956 | 18 | C16PEO20 | 1122 | 16 | 0.0001 | 10 | D | C |
| Comparative Example 8 | PEO—PPO—PEO | 9000 | 16 | C10PEO10 | 598 | 15 | 0.000009 | 73 | C | A |
| Comparative Example 9 | PEO—PPO—PEO | 9000 | 16 | C10PEO10 | 598 | 15 | 0.13 | 80 | D | C |
| Comparative Example 10 | C24PEO20 | 1308 | 15 | C10PEO10 | 598 | 15 | 0.001 | 93 | D | C |

PEO—PPO—PEO: block copolymer of polyoxyethylene-polyoxypropylene
C8PEO6: polyoxyethylene (6) 2-ethylhexyl ether
C10PEO5: polyoxyel hylene (5) decyl ether
C10PEO10: polyoxyethylene (10) decyl ether
C12PBO15: polyoxyethylene (15) lauryl ether
C12PEO30: polyoxyethylene (30) lauryl ether
C12PEO40: polyoxyethylene (40) lauryl ether
C16PEO20: polyoxyethylene (20) cetyl ether
C24PEO20: polyoxyethylene (20) sorbitan monooleate
PEG: polyethylene glycol

TABLE 2

| | |
|---|---|
| Polishing machine: | Single wafer polishing machine PNX-322 (manufactured by Okamoto Machine Tool Works, Ltd.) |
| Polishing load: | 15 kPa |
| Rotation speed of surface platen: | 30 rpm |
| Rotation speed of head: | 30 rpm |
| Polishing period: | 4 min |
| Temperature of surface treatment composition: | 20° C. |
| Feed rate of surface treatment composition: | 0.5 L/min (continuously fed without being circulated) |

TABLE 3

| | |
|---|---|
| Polishing machine: | Bench-type polishing machine EJ-380IN (manufactured by Engis Japan Corporation) |
| Polishing load: | 15 kPa |
| Rotation speed of surface platen: | 30 rpm |
| Rotation speed of head: | 30 rpm |
| Polishing period: | 1 min |
| Temperature of surface treatment composition: | 20° C. |
| Feed rate of surface treatment composition: | 0.25 L/min (continuously fed without being circulated) |

As shown in Table 1, it was found that the haze levels of Examples 1 to 15 are lower than those of Comparative Examples 1 to 10.

The invention claimed is:

1. A surface treatment composition comprising a first surfactant, a second surfactant, a basic compound, and water, the surface treatment composition having a pH of 8 or more,
   wherein the second surfactant has a weight-average molecular weight ½ times or less that of the first surfactant, and the sum of a content of the first surfactant and a content of the second surfactant is 0.00001 to 0.1% by mass, and
   wherein both the first surfactant and the second surfactant are nonionic surfactants.

2. The surface treatment composition according to claim 1, wherein a ratio of a total number of carbon atoms of the second surfactant to a sum of a total number of carbon atoms of the first surfactant and the total number of carbon atoms of the second surfactant is 1 to 90%.

3. The surface treatment composition according to claim 1, wherein the first surfactant has a weight-average molecular weight of 500 to 20,000.

4. The surface treatment composition according to claim 1, further comprising a particle component.

5. The surface treatment composition according to claim 4, wherein the particle component is silicon dioxide.

6. The surface treatment composition according to claim 1, further comprising a wetting agent.

7. The surface treatment composition according to claim 1, wherein the surface treatment composition is used in an application of subjecting a silicon wafer to surface treatment.

8. The surface treatment composition according to claim 1, wherein the surface treatment composition is used in an application of polishing or rinsing a surface of a substrate.

9. A surface treatment method comprising polishing, washing, rinsing, or etching a surface of a substrate using the surface treatment composition according to claim 1.

10. The surface treatment method according to claim 9, wherein the substrate is a silicon wafer.

11. A surface treatment method comprising polishing or rinsing a surface of a substrate using the surface treatment composition according to claim 1.

12. The surface treatment method according to claim 11, wherein the substrate is a silicon wafer.

* * * * *